United States Patent [19]

Fujita et al.

[11] 4,139,842
[45] Feb. 13, 1979

[54] AUDIBLE ALARM UNIT

[76] Inventors: Nobuhiko Fujita; Hiroshi Saito, both of 1, Aza-miyahigashi, Koya, Itami-shi, Hyogo-ken, Japan

[21] Appl. No.: 787,461

[22] Filed: Apr. 14, 1977

[51] Int. Cl.² .......................... H03B 5/30; G08B 3/00
[52] U.S. Cl. ............................ 340/384 E; 340/384 R; 331/116 R
[58] Field of Search ................... 340/384 E, 384 R; 331/116 R

[56] References Cited

U.S. PATENT DOCUMENTS

| | | | |
|---|---|---|---|
| 3,728,641 | 4/1973 | Fujita | 331/116 R |
| 3,778,648 | 12/1973 | Kawada | 331/116 R |
| 3,878,408 | 4/1975 | Nemoto | 331/116 R |
| 3,878,481 | 4/1975 | Healey | 331/116 R |
| 4,001,724 | 1/1977 | Keller | 331/116 R |

Primary Examiner—Harold I. Pitts
Attorney, Agent, or Firm—Wenderoth, Lind & Ponack

[57] ABSTRACT

The present invention is an audible alarm unit including a coil, a resistor, an NPN transistor, and a piezoelectric transducer having first and second electrodes and a feedback electrode. The collector and emitter of the transistor and the coil are connected in series between positive and negative terminals of a direct current power source. The base of the transistor is connected to the collector through the resistor. The first and second electrodes of the piezoelectric transducer are connected either to both ends of the coil or to the collector and emitter of the transistor, respectively. The feedback electrode of the piezoelectric transducer is connected to the base of the transistor.

8 Claims, 7 Drawing Figures

AUDIBLE ALARM UNIT

BACKGROUND OF THE INVENTION

The present invention relates to an audible alarm unit using a piezoelectric transducer which has three electrodes, and more particularly to an improvement of in the drive circuit of a self-excited oscillation system for use in an audible alarm unit.

As shown in FIGS. 1 and 2, a piezoelectric transducer 10 comprises a vibration plate 11 made of a material such as brass serving as a first practical electrode secured to an electrode 14 beneath a piezoelectric element 15, a second electrode 12 on the upper face of the element 15, and a third feedback electrode 13 separate from the second electrode 12. As illustrated in FIG. 1, a lead wire is connected to each of the electrodes 11, 12 and 13.

As illustrated in FIG. 3, a conventional drive circuit of the self-excited oscillation type for an audible alarm unit comprises an NPN transistor 20 having a collector 21, an emitter 22 and a base 23, a first resistor 41, a second resistor 42, and the piezoelectric transducer 10. The collector 21 of the transistor 20 is connected to a positive terminal 31 of a direct current power source, the emitter 22 to a negative terminal 32 through the first resistor 41, and the base 23 to the positive terminal 31 through the second resistor 42. Further, the first electrode 11 is connected to the emitter 22, the second electrode 12 is connected to the negative terminal 32 and the third electrode 13 is connected to the base 23. This drive circuit has a disadvantage in that the voltage applied to the piezoelectric transducer 10 cannot be raised above that of the direct current power source since the first electrode 11 and the second electrode 12 of the transducer 10 are connected to the ends of the emitter resistor 41. Therefore, in order to increase the vibration amplitude of the transducer 10 or to increase sound volume, it is necessary to provide a voltage transformer circuit connected to the direct current power source for increasing the voltage, or to provide an alarm casing or horn for improving the acoustical effect, as disclosed in U.S. Pat. Nos. 3,569,963 and 3,890,612.

SUMMARY OF THE INVENTION

These methods, however, have various defects because they require many component parts and elements, resulting in a complicated structure as well as larger dimensions of the alarm casing, thus rendering these methods inconvenient in practical use.

A primary object of the present invention is to obviate the above defects and disadvantages in the prior art devices, and to provide an audible alarm unit which has a drive circuit making it possible to obtain more than twice the voltage of the power source without a special transformer circuit.

A further object of the present invention is to provide an audible alarm unit having an extremely simple construction.

BRIEF DESCRIPTION OF THE DRAWINGS

Other objects and features of the present invention will be apparent from the following description of the invention with reference to the accompanying drawings, in which.

Throughout the drawings, similar parts and elements are designated by similar reference numerals.

DETAILED DESCRIPTION OF THE INVENTION

Figure 1:
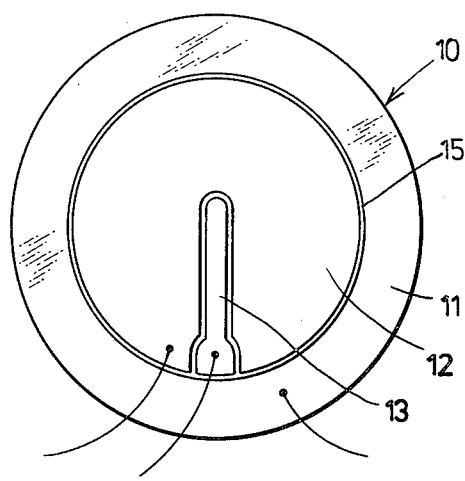
FIG. 1 is a plan view of a piezoelectric transducer.
Figure 2:
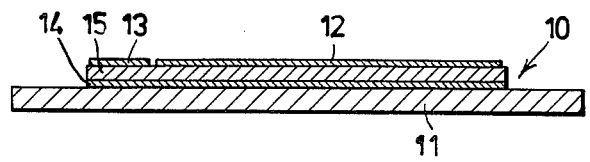
FIG. 2 is a sectional view of the piezoelectric transducer.
Figures 3, 4:
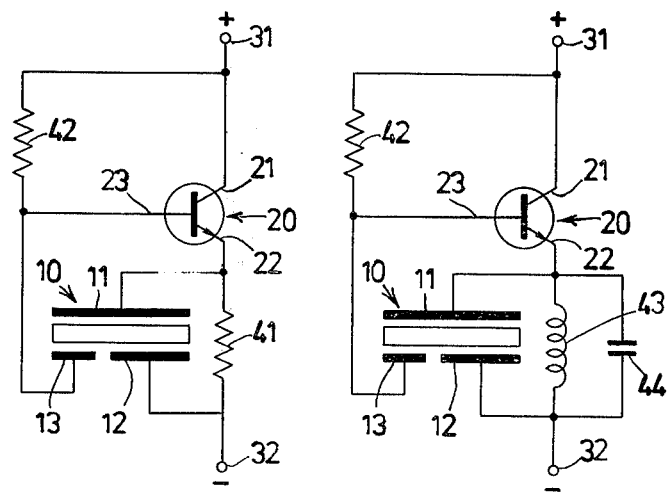
FIG. 3 is a circuit diagram showing a prior art drive circuit.
FIGS. 4 through 7 are circuit diagrams illustrating drive circuits of the present invention.

Referring now to FIG. 4 showing a first embodiment of the invention, the collector 21 of the transistor 20 is connected to the positive terminal 31 of a direct current power source (not shown), the emitter 22 to the negative terminal 32 through a coil 43, and the base 23 to the positive terminal 31 through the resistor 42. A capacitor 44 is connected in parallel to the coil 43. The surface electrode 12 is connected to the negative terminal 32 of the direct current power source, the electrode 11 is connected to the emitter 22 of the transistor 20 and the electrode 13 is connected to the base 23 of the transistor 20.

In the operation of the circuit of the present invention, the transistor 20 is turned on immediately after the supply of direct current since it is self-biased by the resistor 42. As a result, the voltage across the ends of the coil 43 gradually increases to permit the electric potential of the emitter 22 to nearly reach the voltage of the positive terminal 31, whereby the piezoelectric transducer 10 which has the electrodes 11 and 12 are respectively connected to the ends of the coil 43 is caused to bend owing to the electrostriction effect.

The deformation of the piezoelectric transducer 10 generates a feedback signal having a negative potential at the feedback electrode 13 owing to the piezoelectric effect, thus causing the electric potential at the base 23 of the transistor 20 to gradually drop so that the transistor 20 is finally turned off. By this turning off a counter electromotive potential is generated in the coil 43. As a result, in reverse of the above, the electric potential of the emitter 22 of the transistor 20 gradually drops to a negative potential approximately equivalent to or more than that of the power source. By this change of polarity, the piezoelectric transducer 10 bends reversely to the above. The deformation in the reverse direction of the piezoelectric transducer 10 generates a feedback signal having a positive potential at the feedback electrode 13. This signal is supplied to the base 23 of the transistor 20 to gradually elevate the potential of the base 23 so that the transistor 20 is again turned on to return to the original condition.

The above operation is repeated in the same cycle as the resonance frequency of the piezoelectric transducer.

As descrived above, according to the present invention, the vibration amplitude of the piezoelectric transducer 10 can be increased to increase the sound volume since the voltage applied to the transducer 10 is twice or more than that of the direct current power source and since the frequency is the resonance frequency of the transducer 10.

Figure 5:
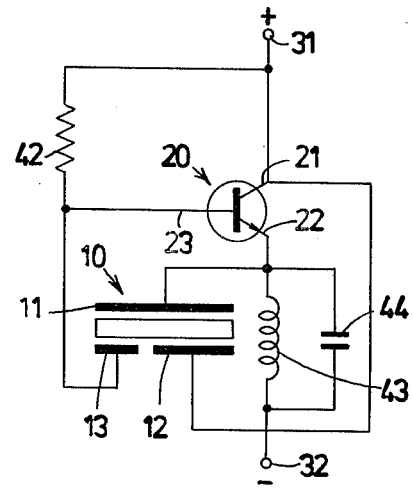
Figure 6:
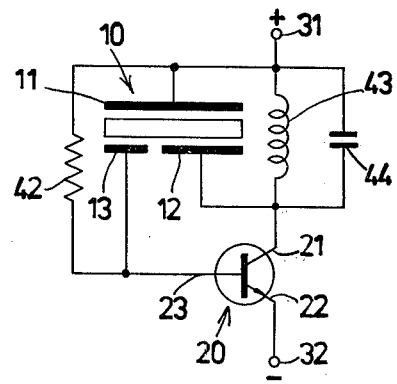
Figure 7:
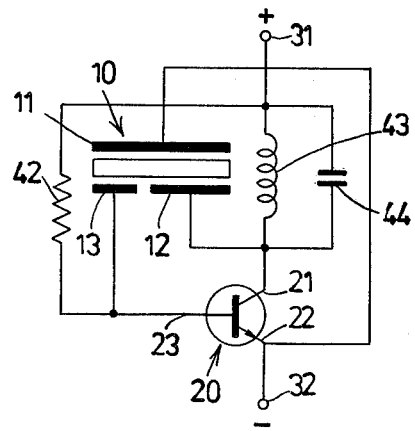

FIGS. 5 through 7 show further embodiments of the invention wherein the coil 43, capacitor 44, electrode 11 and electrode 12 are connected to different points, which however will be self-explanatory. These circuits operate in a manner similar to that of FIG. 4, and have the same features and effects as the latter.

Although not shown in the drawings, a resistor can be inserted in series between the feedback electrode 13 and the base 23 of the transistor 20 throughout the circuits of FIGS. 4 to 7 so as to adjust the feedback amplitude.

The capacitor 44 is provided in parallel to the coil 43 so as to reform the wave and to increase the electroacoustic conversion efficiency. For the same purpose, a capacitor can be provided between the collector 21 and emitter 22 of the transistor 20.

Further, the capacitor 44 can be omitted by suitably adjusting inductance of the coil 43 and capacitance between the electrodes 11 and 12 of the transducer 10.

As described hereinbefore in detail, the audible alarm unit using a piezoelectric transducer according to the invention makes it possible to obtain louder sound by increasing the voltage applied to the electrodes of the transducer by means of a simple drive circuit having no voltage transformer circuit. Therefore, the alarm unit can be small, inexpensive and practically useful.

What is claimed is:

1. An audible alarm unit comprising:
   a direct current power source having a positive terminal and a negative terminal;
   a coil;
   a resistor;
   a transistor having a collector, an emitter and a base, said collector, said emitter and said coil being connected in series between said positive and negative terminals of said direct current power source, said base being connected to said collector through said resistor;
   a piezoelectric transducer having first and second electrodes opposite to each other and a feedback electrode separate from said second electrode, said first electrode and said second electrode being connected to respective ends of said coil, said feedback electrode being connected to said base of said transistor; and
   a capacitor connected in parallel to said coil.

2. An audible alarm unit as claimed in claim 1, further comprising a further resistor connected between said feedback electrode and said base of said transistor.

3. An audible alarm unit comprising:
   a direct current power source having a positive terminal and a negative terminal;
   a coil;
   a resistor;
   a transistor having a collector, an emitter and a base, said collector, said emitter and said coil being connected in series between said positive and negative terminals of said direct current power source, said base being connected to said collector through said resistor;
   a piezoelectric transducer having first and second electrodes opposite to each other and a feedback electrode separate from said second electrode, said first electrode being connected to said collector of said transistor, said second electrode being connected to said emitter of said transistor and said feedback electrode being connected to said base of said transistor; and
   a capacitor connected in parallel to said coil.

4. An audible alarm unit as claimed in claim 3, further comprising a further resistor connected between said feedback electrode and said base of said transistor.

5. An audible alarm unit comprising:
   a direct current power source having a positive terminal and a negative terminal;
   a coil;
   a resistor;
   a transistor having a collector, an emitter and a base, said collector, said emitter and said coil being connected in series between said positive and negative terminals of said direct current power source, said base being connected to said collector through said resistor;
   a piezoelectric transducer having first and second electrodes opposite to each other and a feedback electrode separate from said second electrode, said first and second electrodes being connected to respective ends of said coil, said feedback electrode being connected to said base of said transistor; and
   a capacitor having terminals connected to said collector and said emitter of said transistor respectively.

6. An audible alarm unit as claimed in claim 5, further comprising a further resistor connected between said feedback electrode and said base of said transistor.

7. An audible alarm unit comprising:
   a direct current power source having a positive terminal and a negative terminal;
   a coil;
   a resistor;
   a transistor having a collector, an emitter and a base, said collector, said emitter and said coil being connected in series between said positive and negative terminals of said direct current power source, said base being connected to said collector through said resistor;
   a piezoelectric transducer having first and second electrodes opposite to each other and a feedback electrode separate from said second electrode, said first electrode being connected to said collector of said transistor, said second electrode being connected to said emitter of said transistor and said feedback electrodes being connected to said base of said transistor; and
   a capacitor having terminals connected to said collector and said emitter of said transistor respectively.

8. An audible alarm unit as claimed in claim 7, further comprising a further resistor connected between said feedback electrode and said base of said transistor.